(12) United States Patent
Joei et al.

(10) Patent No.: US 10,840,303 B2
(45) Date of Patent: *Nov. 17, 2020

(54) SOLID STATE IMAGE SENSOR, PRODUCTION METHOD THEREOF AND ELECTRONIC DEVICE

(71) Applicant: SONY SEMICONDUCTOR SOLUTIONS CORPORATION, Kanagawa (JP)

(72) Inventors: Masahiro Joei, Kanagawa (JP); Kaori Takimoto, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/378,339

(22) Filed: Apr. 8, 2019

(65) Prior Publication Data

US 2019/0237513 A1  Aug. 1, 2019

Related U.S. Application Data

(63) Continuation of application No. 16/018,879, filed on Jun. 26, 2018, now Pat. No. 10,304,904, which is a continuation of application No. 15/589,681, filed on May 8, 2017, now Pat. No. 10,014,349, which is a continuation of application No. 14/477,639, filed on Sep. 4, 2014, now Pat. No. 9,666,643.

(30) Foreign Application Priority Data

Sep. 12, 2013 (JP) .................................. 2013-189723

(51) Int. Cl.
*H01L 27/30* (2006.01)
*H01L 51/44* (2006.01)
*H01L 27/146* (2006.01)

(52) U.S. Cl.
CPC ...... *H01L 27/307* (2013.01); *H01L 27/14643* (2013.01); *H01L 51/441* (2013.01)

(58) Field of Classification Search
None
See application file for complete search history.

(56) References Cited

U.S. PATENT DOCUMENTS

| | | | |
|---|---|---|---|
| 2011/0019042 A1* | 1/2011 | Yamaguchi | H01L 27/14632 348/280 |
| 2014/0231782 A1* | 8/2014 | Imai | H01L 51/448 257/40 |

* cited by examiner

*Primary Examiner* — Mounir S Amer
(74) *Attorney, Agent, or Firm* — Sheridan Ross P.C.

(57) ABSTRACT

A solid state image sensor includes a semiconductor substrate where photoelectric conversion regions for converting light into charges are arranged per pixel planarly arranged; an organic photoelectric conversion film laminated at a light irradiated side of the semiconductor substrate via an insulation film and formed at the regions where the pixels are formed; a lower electrode formed at and in contact with the organic photoelectric conversion film at a semiconductor substrate side; a first upper electrode laminated at a light irradiated side of the organic photoelectric conversion film and formed such that ends of the first upper electrode are substantially conform with ends of the organic photoelectric conversion film when the solid state image sensor is planarly viewed; and a film stress suppressor for suppressing an effect of a film stress on the organic photoelectric conversion film, the film stress being generated on the first upper electrode.

20 Claims, 11 Drawing Sheets

SOLID STATE IMAGE SENSOR, PRODUCTION METHOD THEREOF AND ELECTRONIC DEVICE

CROSS REFERENCE TO RELATED APPLICATIONS

This application is a continuation of U.S. patent application Ser. No. 16/018,879, filed Jun. 26, 2018, which is a continuation of U.S. patent application Ser. No. 15/589,681, filed May 8, 2017, now U.S. Pat. No. 10,014,349, which is a continuation of U.S. patent application Ser. No. 14/477,639, filed Sep. 4, 2014, now U.S. Pat. No. 9,666,643, which claims the benefit of Japanese Priority Patent Application JP 2013-189723 filed Sep. 12, 2013, the entire contents of which are incorporated herein by reference.

BACKGROUND

The present disclosure relates to a solid state image sensor, a production method thereof and an electronic device. More particularly, the present disclosure relates to a solid state image sensor, a production method thereof and an electronic device for suppressing a dark current and a property fluctuation of white flaws of an organic photoelectric conversion film.

SUMMARY

In the electronic device in the related art having an image capturing function such as a digital still camera and a digital video camera, a solid state image sensor such as CCD (Charge Coupled Device) and CMOS (Complementary Metal Oxide Semiconductor) image sensors are used. The solid state image sensor has pixels where PDs (photodiodes) for photoelectric conversion and a plurality of transistors are disposed. By the solid state image sensor, images are constructed based on pixel signals outputted from a plurality of pixels planarly arranged.

In recent years, as a pixel size of the solid state image sensor gets smaller, a photon number (a light amount) incident on a unit pixel is increased. The sensitivity of pixels may be decreased, which may result in a decreased S/N (Signal/Noise) ratio.

Currently, there are widely used a solid state image sensor using a pixel arrangement where red, green and blue pixels are planarly arranged, e.g., the Bayer arrangement using a primary color filter. In such a solid state image sensor, green and blue colors do not transmit through a red pixel that is not used for photoelectric conversion. There may result in a loss of the sensitivity. In addition, as a color signal is generated by interpolation between pixels, a false color may be generated.

In response, there is proposed a solid state image sensor having a structure where three photoelectric conversion layers are laminated in a longitudinal direction, and three color photoelectric conversion signals are provided in one pixel.

For example, Japanese Patent Application Laid-open No. 2003-332551 discloses a solid state image sensor having a photoelectric conversion unit for detecting green light and generating a signal charge corresponding to the green light disposed above a silicon substrate, and two photoelectric conversion regions for detecting blue and red lights laminated within the silicon substrate.

Furthermore, as one of the solid state image sensors having the above-described structures, a rear surface irradiation type solid state image sensor where a circuit forming surface is formed at an opposite side of a light receiving plane is proposed.

For example, by a rear surface irradiation type solid state image sensor disclosed in Japanese Patent Application Laid-open No. 2011-29337, an inorganic photoelectric conversion unit and an organic photoelectric conversion unit within a same pixel are brought close each other, thereby suppressing F value dependency of each color and sensitivity fluctuation among the respective colors.

Japanese Patent Application Laid-open No. 2011-228648 discloses an image sensor that can suppress an occurrence of white spot defects.

As to the solid state image sensor disclosed in the above-described Japanese Patent Application Laid-open No. 2011-29337, ends of the organic photoelectric conversion film and the upper electrode are conform. In a heat treatment in the course of manufacture, a film stress of the upper electrode may be locally concentrated on an organic photoelectric conversion film. Thus, as shown in a relationship between the stress and the white flaws disclosed in Japanese Patent Application Laid-open No. 2011-228648, there is a concern that a dark current and a property fluctuation of the white flaws of the organic photoelectric conversion film are dominantly generated.

In view of the circumstances as described above, there is a need for suppressing a dark current and a property fluctuation of white flaws of an organic photoelectric conversion film.

According to an embodiment of the present disclosure, there is provided a solid state image sensor, including: a semiconductor substrate where photoelectric conversion regions for converting light into charges are arranged per a plurality of pixels planarly arranged; an organic photoelectric conversion film laminated at a light irradiated side of the semiconductor substrate via an insulation film and formed at the regions where a plurality of the pixels are formed; a lower electrode formed at and in contact with the organic photoelectric conversion film at a semiconductor substrate side; a first upper electrode laminated at a light irradiated side of the organic photoelectric conversion film and formed such that ends of the first upper electrode are substantially conform with ends of the organic photoelectric conversion film when the solid state image sensor is planarly viewed; and a film stress suppressor for suppressing an effect of a film stress on the organic photoelectric conversion film, the film stress being generated on the first upper electrode.

According to an embodiment of the present disclosure, there is provided a method of producing a solid state image sensor, including: forming and laminating an organic photoelectric conversion film on a semiconductor substrate via an insulation film at a light irradiated side and at the regions where a plurality of pixels are formed, photoelectric conversion regions for converting light into charges being arranged per a plurality of the pixels planarly arranged on the semiconductor substrate; forming a lower electrode per the pixels in contact with the organic photoelectric conversion film at a semiconductor substrate side; forming a first upper electrode laminated at a light irradiated side of the organic photoelectric conversion film such that ends of the first upper electrode are substantially conform with ends of the organic photoelectric conversion film when the solid state image sensor is planarly viewed; and forming a film stress suppressor for suppressing an effect of a film stress on the organic photoelectric conversion film, the film stress being generated on the first upper electrode.

According to an embodiment of the present disclosure, there is provided an electronic device, including: a solid state image sensor, including: a semiconductor substrate where photoelectric conversion regions for converting light into charges are arranged per a plurality of pixels planarly arranged; an organic photoelectric conversion film laminated at a light irradiated side of the semiconductor substrate via an insulation film and formed at the regions where a plurality of the pixels are formed; a lower electrode formed at and in contact with the organic photoelectric conversion film at a semiconductor substrate side; a first upper electrode laminated at a light irradiated side of the organic photoelectric conversion film and formed such that ends of the first upper electrode are substantially conform with ends of the organic photoelectric conversion film when the solid state image sensor is planarly viewed; and a film stress suppressor for suppressing an effect of a film stress on the organic photoelectric conversion film, the film stress being generated on the first upper electrode.

According to an embodiment of the present disclosure, the organic photoelectric conversion film is formed and laminated on the semiconductor substrate via the insulation film at the light irradiated side and at the regions where a plurality of pixels are formed, photoelectric conversion regions for converting light into charges being arranged per a plurality of the pixels planarly arranged on the semiconductor substrate. The lower electrode is formed at and in contact with the organic photoelectric conversion film at the semiconductor substrate side. The first upper electrode is laminated at the light irradiated side of the organic photoelectric conversion film and formed such that the ends of the first upper electrode are substantially conform with ends of the organic photoelectric conversion film when the solid state image sensor is planarly viewed. The film stress suppressor for suppressing an effect of a film stress on the organic photoelectric conversion film, the film stress being generated on the first upper electrode.

According to an embodiment of the present disclosure, the property fluctuation such as the dark current and the white flaws of the organic photoelectric conversion film can be suppressed.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, an embodiment of the present disclosure will be described with reference to the drawings.

Figure 1:
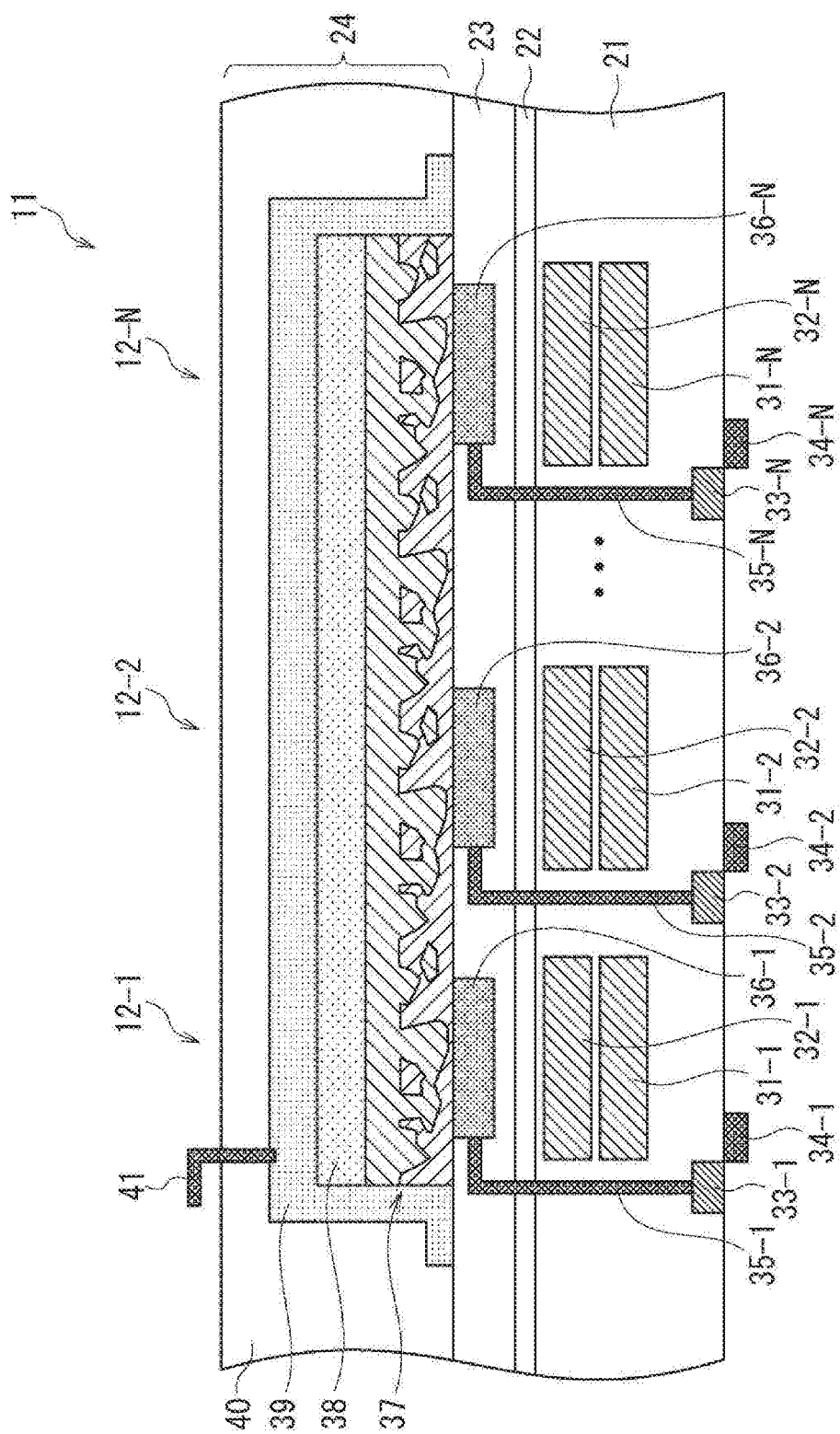
FIG. 1 is a cross-sectional view of a first embodiment of a solid state image sensor with the application of the present disclosure.

FIG. 1 is a cross-sectional view of a first embodiment of a solid state image sensor with the application of the present disclosure.

A solid state image sensor 11 is configured to have a plurality of pixels 12 arranged in a planar array. FIG. 1 shows a cross-section where N numbers of pixels 12-1 to 12-N are arranged. Hereinafter, when the pixels 12-1 to 12-N are interchangeable, it refers to the pixel 12. The same applies to each part configuring the pixel 12. Also, in FIG. 1, a plane of the solid state image sensor 11 directed upward is irradiated with light. Hereinafter, the plane is referred to as "a light irradiated plane", as appropriate. In addition, in FIG. 1, a wiring layer (not shown) is laminated on a plane of the solid state image sensor 11 directed downward. Hereinafter, the plane is referred to as "a wiring layer laminated plane".

As shown in FIG. 1, the solid state image sensor 11 is configured of a semiconductor substrate 21, insulation films 22 and 23 and an organic photoelectric conversion film 24 laminated thereon.

Also, each pixel 12 of the solid state image sensor 11 is configured of photoelectric conversion regions 31 and 32, a charge buildup region 33, a gate electrode 34, a wiring 35 and a lower electrode 36. In other words, a pixel 12-1 is configured of photoelectric conversion regions 31-1 and 32-1, a charge buildup region 22-1, a gate electrode 34-1, a wiring 35-1 and a lower electrode 36-1. Similarly, a pixel 12-2 is configured of photoelectric conversion regions 31-2 and 32-2, a charge buildup region 22-2, a gate electrode 34-2, a wiring 35-2 and a lower electrode 36-2. Hereinafter, the same applies up to the pixel 12-N.

The semiconductor substrate 21 is a silicon wafer where single crystals of high purity silicon are thin-sliced. At a wiring layer laminated plane side of the semiconductor substrate 21, a plurality of transistors (not shown) (for example, a transfer transistor, an amplifier transistor, a selection transistor and reset transistor) are formed. Furthermore, on a peripheral region around the pixel 12 of the semiconductor substrate 21, a peripheral circuit (not shown) such as a logic circuit is formed. On the wiring layer laminated plane of the semiconductor substrate 21, a multilayer wiring layer where a plurality of wiring layers are arranged via interlayer insulation films is laminated. On the multilayer wiring layer, a support substrate (not shown) for supporting the thin semiconductor substrate 21 is adhered.

The insulation film 22 is for insulating the light irradiated plane of the semiconductor substrate 21. As the insulation film 22, a film having a low interface state is desirable in order to decrease the interface state between the insulation film 22 and the semiconductor substrate 21 and to suppress a dark current from the interface between the semiconductor substrate 21 and the insulation film 22.

The insulation film 23 is for insulating the lower electrodes 36, and is a SiO$_2$ (silicon dioxide) film, for example.

In the organic photoelectric conversion layer 24, an organic photoelectric conversion film 37, a first upper electrode 38 and a second upper electrode 39 are laminated to cover the region where a plurality of pixels 12 are arranged. A passivation film 40 is wholly formed. A wiring 41 is connected to the second upper electrode 39.

The photoelectric conversion regions 31 and 32 are formed to be laminated in a depth direction (a top and bottom direction in FIG. 1) within the semiconductor substrate 21. For example, the photoelectric conversion regions 31 photoelectrically convert blue light. The photoelectric conversion regions 32 formed at a deeper position than the photoelectric conversion regions 31 (far from the light irradiated plane) photoelectrically convert red light.

Each charge buildup region 33 is formed within the semiconductor substrate 21 at the wiring layer laminated plane side, and is connected to each lower electrode 36 via each wiring 35. The charge buildup region 33 builds up charges that are photoelectrically converted at a part of the organic photoelectric conversion film 37 connected and disposed between the lower electrode 36 and the upper electrode 38. The charges built up in the charge buildup region 33 are applied to a gate electrode of the amplifier transistor (not shown) via the transfer transistor configured of the gate electrode 34.

Each gate electrode 34 is laminated on a surface of the wiring layer laminated plane of the semiconductor substrate 21, and configures the transfer transistor that transfers the charges accumulated on the charge buildup region 33, for example.

Each wiring 35 connects each charge buildup region 33 to each lower electrode 36 per pixel 12. Also, each wiring 35 acts as a light shielding film that shields light on the region between the pixels 12, for example.

Each lower electrode 36 is formed at and in contact with the organic photoelectric conversion film 37 at a semiconductor substrate side 21. As described above, the lower electrodes 36 of the respective pixels 12 are insulated each other by the insulation film 23.

The organic photoelectric conversion film 37 is composed of an organic material as described later, performs the photoelectric conversion, and is laminated on an entire surface of the regions where the pixels 12 are arranged. For example, the organic photoelectric conversion film 37 photoelectrically converts green light.

The first upper electrode 38 is laminated on the organic photoelectric conversion film 37, and is formed such that ends of the first upper electrode 38 is substantially conform with ends of the organic photoelectric conversion film 37 when the solid state image sensor 11 is planarly viewed.

The second upper electrode 39 is laminated on the first upper electrode 38 at a region greater than a region where the first upper electrode 38 is formed, i.e., across the first upper electrode 38 to connect a peripheral region of the second upper electrode 39 to the insulation film 23. In this way, the second upper electrode 39 is formed to press the first upper electrode 38, thereby suppressing an effect of a film stress on the ends of the organic photoelectric conversion film 37. The film stress is generated on the first upper electrode 38 in a later heating step. For example, even though the film stress such as bending backward is generated on the first upper electrode 38, the peripheral region of the second upper electrode 39 is connected to the insulation film 23, whereby the second upper electrode 39 can suppress the bending backward of the first upper electrode 38.

The passivation film 40 is for protecting the surface of the solid image sensor 11.

The wiring 41 is connected to an external circuit (not shown) in order to apply a predetermined potential to the first and second upper electrodes 38 and 39.

In the solid state image sensor 11 configured in this way, among the lights irradiated from an upper side in FIG. 1, green light is photoelectrically converted in the organic photoelectric conversion film 37, blue light is photoelectrically converted in the photoelectric conversion regions 32, and red light is photoelectrically converted in the photoelectric conversion regions 31. Then, the second upper electrode 39 can suppress the effect of the film stress generated on the first upper electrode 38 on the ends of the organic photoelectric conversion film 37. Thus, the film stress on the organic photoelectric conversion film 37 can be uniform, and the property fluctuation such as white flaws of the organic photoelectric conversion film 37 and the dark current can be suppressed.

The solid state image sensor 11 can avoid light loss by using a color filter and can provide a higher photoelectric conversion efficiency compared to, for example, a solid image sensor utilizing the Bayer arrangement using a primary color filter.

Next, referring to FIGS. 2 to 7, a method of producing a solid state image sensor 11 will be described.

Figure 2:
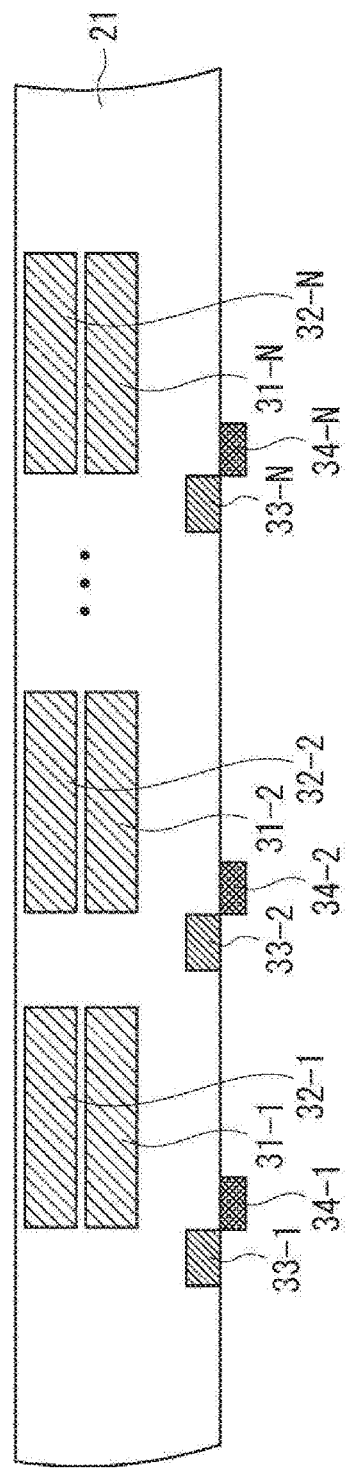
FIG. 2 illustrates a first step of producing the solid state image sensor shown in FIG. 1.

Firstly, in a first step, the photoelectric conversion regions 31 and 32 are formed within the semiconductor substrate 21 that is not thinned, as shown in FIG. 2. At the wiring layer laminated plane side of the semiconductor substrate 21, the charge buildup region 33 is formed. On the surface of the wiring layer laminated plane of the semiconductor substrate 21, the gate electrodes 34 and so on are laminated via the insulation film (not shown). A plurality of the pixel transistors including the transfer transistor are formed.

Then, a peripheral circuit (not shown) is formed on the semiconductor substrate 21. The multilayer wiring layer (not shown) is laminated on the wiring layer laminated plane of the semiconductor substrate 21. To the multilayer wiring layer, the support substrate is adhered. Thereafter, silicon and a silicon oxide film at a light irradiated plane side of the semiconductor substrate 21 are removed. This allows to thin the semiconductor substrate 21 as shown in FIG. 2 and to expose the light irradiated plane of the semiconductor substrate 21 (in other words, a rear surface of the semiconductor substrate 21 when the side where the multilayer wiring layer and the support substrate are laminated is defined as the surface).

Figure 3:
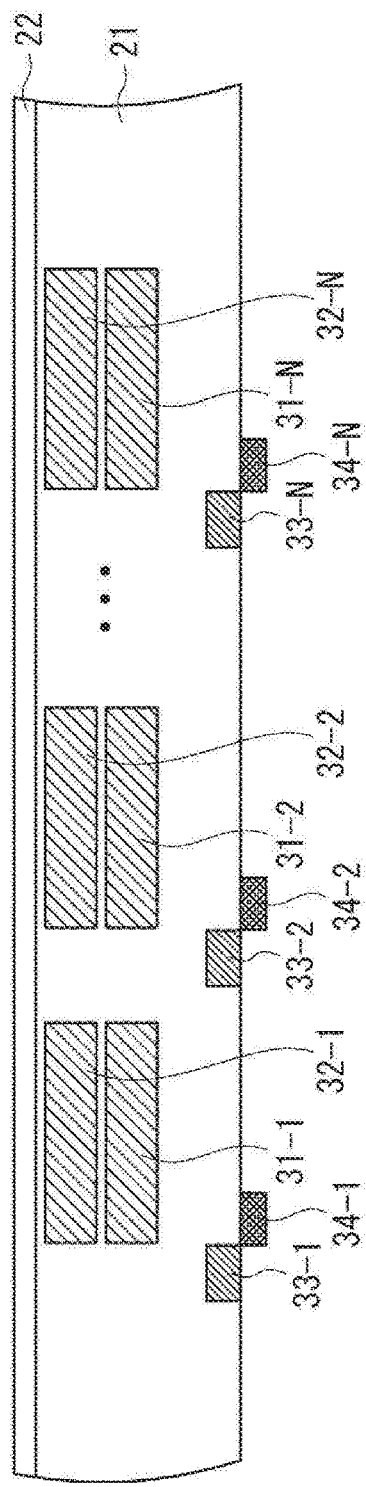
FIG. 3 illustrates a second step of producing the solid state image sensor shown in FIG. 1.

Next, in a second step, the insulation film 22 is laminated on the light irradiated plane of the semiconductor substrate 21, as shown in FIG. 3. For example, as the insulation film 22, a lamination structure of a hafnium oxide ($HfO_2$) film formed by an ALD (Atomic Layer Deposition) method and a plasma CVD (Chemical Vapor Deposition) method. The structure and the film forming method of the insulation film 22 are not limited thereto.

Figure 4:
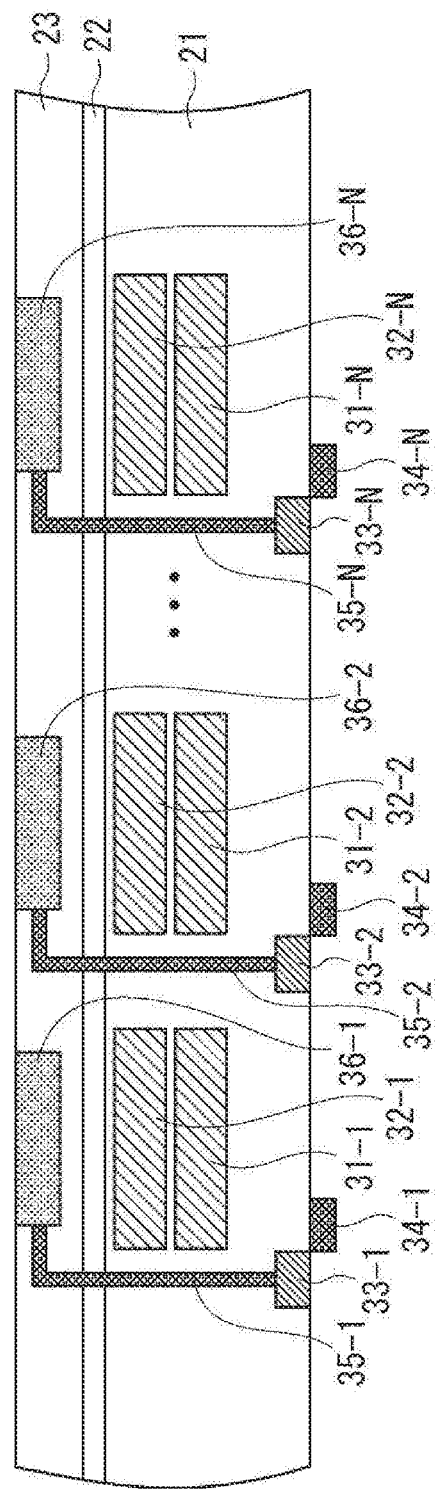
FIG. 4 illustrates a third step of producing the solid state image sensor shown in FIG. 1.

Next, in a third step, as shown in FIG. 4, there are formed through holes that pass through the semiconductor substrate 21 and the insulation film 22 from the light irradiated plane side to the charge buildup regions 33, and the through holes are buried with a conductive material to form the wirings 35. As the material for the wirings 35, a light shielding material is used. The surface of the insulation film 22 is processed to leave a region to be light-shielded. For example, a laminated film of barrier metal titanium (Ti) and titanium nitride (TiN) and tungsten (W) are desirably used. However, the structure and the material of the wirings 35 are not limited thereto.

In this step, the lower electrodes 36 are formed. As the light has to be passed through the lower electrodes 36, the lower electrodes 36 are formed by sputtering ITO (Indium Tin Oxide), patterning using a photolithography technique, and processing by dry or wet etching. Upon the formation of the lower electrodes 36, the insulation film 23 that electrically insulates the lower electrodes 36 is formed. For example, the insulation layer 23 is an $SiO_2$ film formed by a plasma CVD method between the lower electrodes 36, and is planarized by a CMP (Chemical Mechanical Polishing).

As the material of the lower electrodes 36, it is not limited to the above-described ITO, and tin oxide-based $SnO_2$ (dopant added) can also be used. In addition, as the material of the lower electrodes 36, a zinc oxide-based material can be used. Examples of the zinc oxide-based material include aluminum zinc oxide (Al is added as a dopant to ZnO, e.g., AZO), gallium zinc oxide (Ga is added as a dopant to ZnO, e.g., GZO) and indium zinc oxide (In is added as a dopant to ZnO, e.g., IZO). Furthermore, as the material of the lower electrodes 36, IGZO, CuI, $InSbO_4$, ZnMgO, $CuInO_2$, $MgIn_2O_4$, CdO, $ZnSnO_3$ and the like can be used.

In the third step, the lower electrodes 36 are connected to the charge buildup regions 33 via the wirings 35. The wirings 35 and the lower electrodes 36 may be patterned, whichever may be patterned first.

Figure 5:
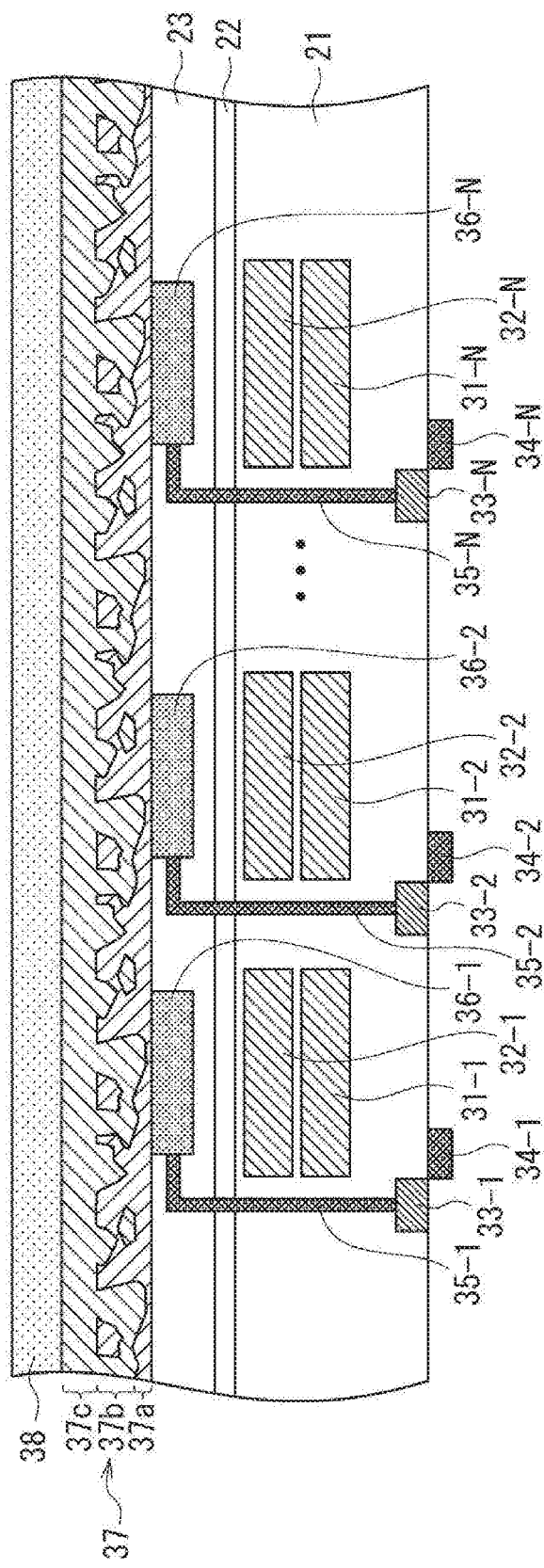
FIG. 5 illustrates a fourth step of producing the solid state image sensor shown in FIG. 1.

Next, in a fourth step, as shown in FIG. 5, the material for the organic photoelectric conversion film 37 is formed on an entire surface of the insulation film 23 and the lower electrodes at the light irradiated plane side. On an entire surface of the film 37, the material for the first upper electrode 38 is film-formed.

The organic photoelectric conversion film 37 is formed using quinacridone by a vacuum deposition method. The organic photoelectric conversion film 37 includes a structure where an electron blocking and buffer film, a photoelectric conversion film, a hole blocking film, a hole blocking and buffer film and a work function adjustment film are laminated on the lower electrodes 36. Specifically, the organic photoelectric conversion film 37 includes a structure having at least one of an organic p type semiconductor and an organic n type semiconductor. More desirably, as shown in FIG. 5, it is desirable that a pin bulk hetero structure including a p type blocking layer 37a, a p and n type codeposition phase (i phase) 37b, and an n type blocking layer 37c.

As the organic p type semiconductor and an n type semiconductor for the organic photoelectric conversion film 37, any of a quinacridone derivative, a naphthalene derivative, an anthracene derivative, a phenanthrene derivative, a tetracene derivative, a pyrene derivative, a perylene derivative and a Fluoranthene derivative can be desirably used. Also, a phenylene vinylene, fluorine, carbazole, indole, pyrene, pyroll, picoline, thiophene, acetylene or diacetylene polymer or a derivative thereof can be used. Furthermore, a chain compound where a fused polycyclic aromatic and aromatic ring or heterocyclic ring compound are fused such as a metal complex pigment, a cyanine-based pigment, a merocyanine-based pigment, a phenyl xanthene-based pigment, a triphenyl methane-based pigment, a Rhoda cyanine-based pigment, a xanthene-based pigment, a macrocyclic azaanuulene-based pigment, an azulene-based pigment, naphthoquinone, an anthraquinone-based pigment, anthracene and pyrene; a cyanine-based analog pigment bonded by two nitrogen-containing hetero rings such as quinolone, benzothiazole and benzooxazole having a squarylium group and a croco nick methane group as a bonding group or by a squarylium group and a croco nick methane group.

As the above-described metal complex pigment, a dithiol metal complex-based pigment, a metal phthalocyanine-based pigment, a metal porphyrin-based pigment or a ruthenium complex pigment is desirable. The ruthenium complex pigment is most desirable. The material for the organic photoelectric conversion film 37 is not limited to the above. The organic photoelectric conversion film 37 may be formed by coating.

The first upper electrode 38 has to be transparent to the visible light, and is formed of ITO by sputtering, for example. As is generally known, the properties of the first upper electrode 38 are greatly changed due to effects of moisture, oxygen and hydrogen. It is therefore desirable to form the first upper electrode 38 in a multi-chamber together with the organic photoelectric conversion film 37. In order to prevent the organic photoelectric conversion film 37 from changing by the ultraviolet rays applied in the production, the first upper electrode 38 is desirably formed of the material that absorbs the ultraviolet rays having a wavelength of 400 nm or less.

The material of the first upper electrode 38 is not limited to the above-described ITO, and may be formed of tin oxide-based $SnO_2$ (dopant added). In addition, as the material of the first upper electrode 38, as a zinc oxide-based material, aluminum zinc oxide (Al is added as a dopant to ZnO, e.g., AZO), gallium zinc oxide (Ga is added as a dopant to ZnO, e.g., GZO) and indium zinc oxide (In is added as a dopant to ZnO, e.g., IZO) can be used. Furthermore, as the material of the upper electrode 38, IGZO, CuI, $InSbO_4$, ZnMgO, $CuInO_2$, $MgIn_2O_4$, CdO, $ZnSnO_3$ and the like can be used.

Figure 6:
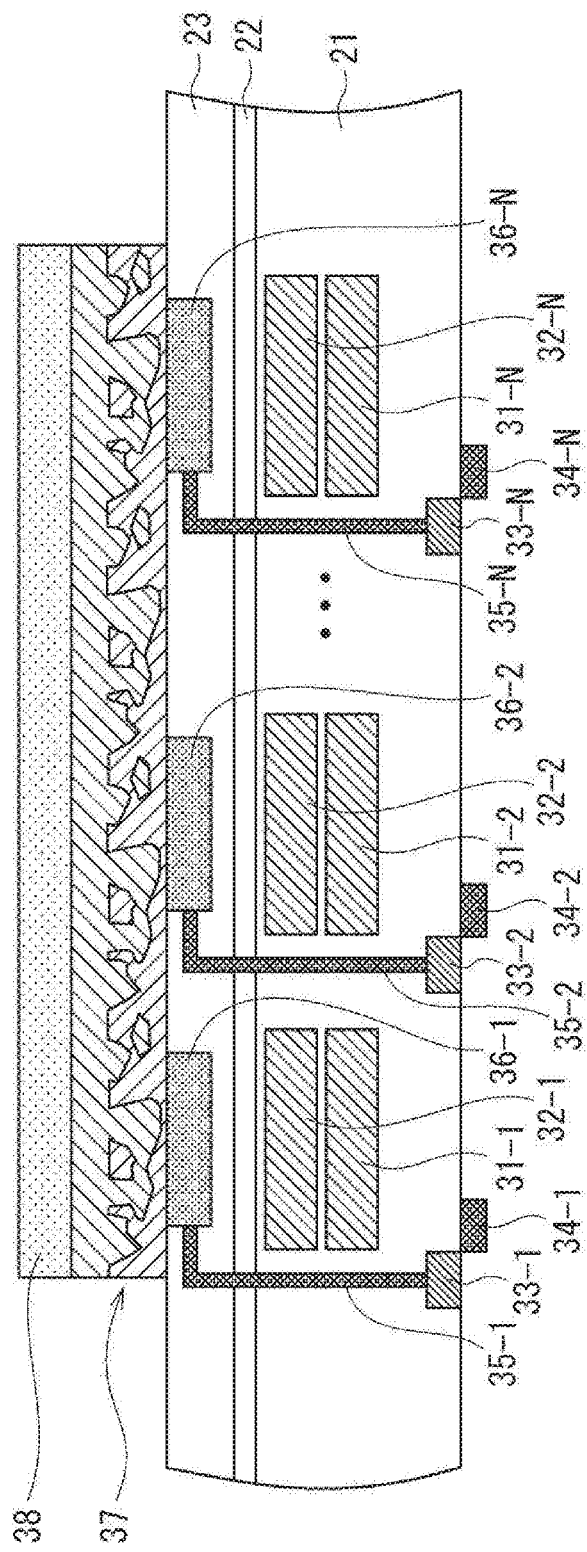
FIG. 6 illustrates a fifth step of producing the solid state image sensor shown in FIG. 1.

Next, in the fifth step, as shown in FIG. 6, the first upper electrode 38 and the organic photoelectric conversion film 37 are processed such that the ends of the first upper electrode 38 is substantially conform with the ends of the organic photoelectric conversion film 37. For example, the first upper electrode 38 and the organic photoelectric conversion film 37 are processed by patterning using a photolithography technique to leave the regions where the pixels 12 are formed, and dry etching to remove other regions the regions where the pixels 12 are formed. Then, post processing such as asking and organic cleaning is performed to remove deposition and residues.

Figure 7:
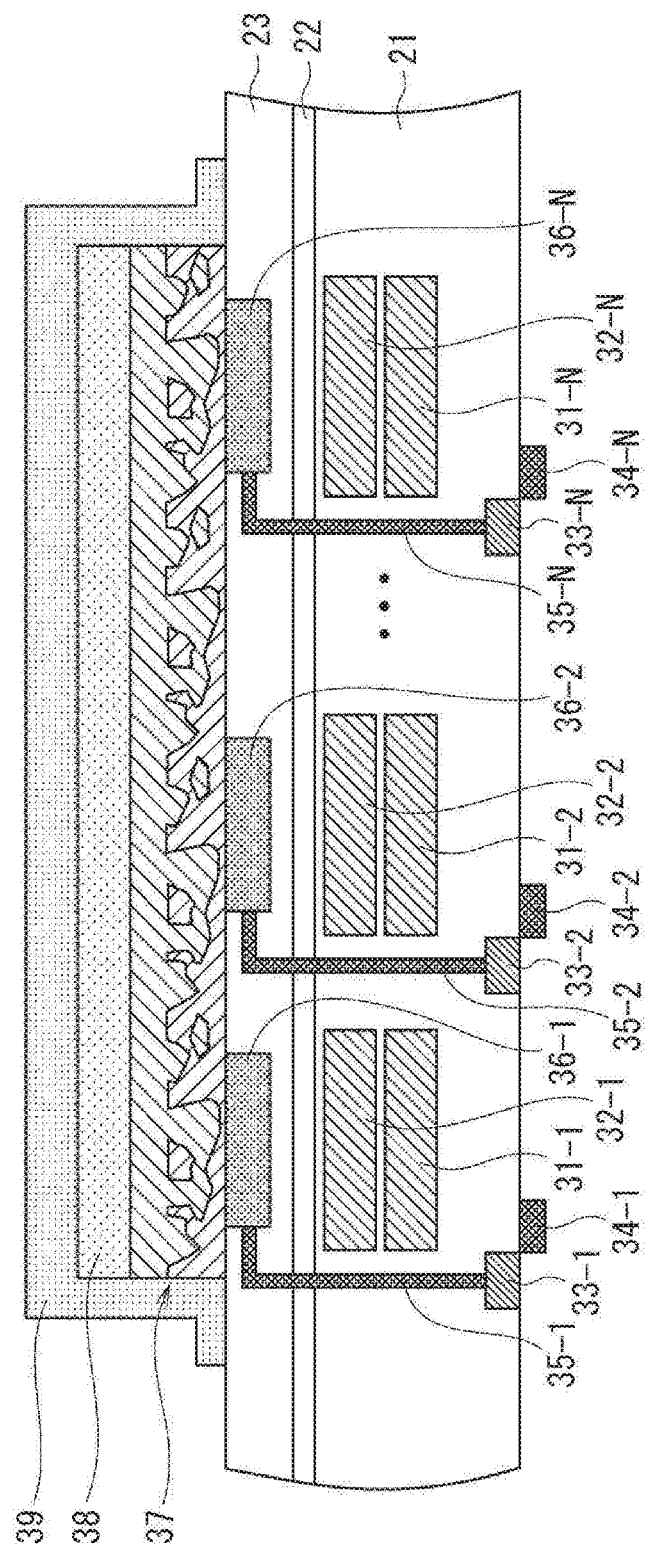
FIG. 7 illustrates a sixth step of producing the solid state image sensor shown in FIG. 1.

Next, in a sixth step, as shown in FIG. 7, the second upper electrode 39 is formed. For example, the material for the second upper electrode 39 is formed on an entire surface of the first upper electrode 38 and the insulation film 23. Then, the second upper electrode 39 is processed by patterning using a photolithography technique such that ends of the second upper electrode 39 extend exceeding the ends of the first upper electrode 38 and then by dry etching.

Here, it is desirable that the same material is used for the first and second upper electrodes 38 and 39. For the second upper electrode 39, there may be used a material which is transparent to the visible light and has the properties (the film stress and a coefficient of thermal expansion) similar to (substantially the same as) those of the material for the first upper electrode 38.

Thereafter, the wiring 41 for electrically connect the first and second upper electrodes 38 and 39 to the external is formed, and the passivation film 40 is formed, there by producing the solid state image sensor 1 shown in FIG. 1.

As a material for the wiring 41, tungsten (W), titanium (Ti), titanium nitride (TiN), aluminum (Al) or the like can be used, for example. For the wiring 41, other material having conductivity may be used. The wiring 41 is formed by patterning using a photolithography technique and processing by dry etching. Then, post processing such as asking and organic cleaning is performed to remove deposition and residues.

After the passivation film 40 is formed, a planarized film, an on-chip lens and the like (not shown) are formed.

As described above, even if the solid state image sensor 11 has a configuration that the ends of the organic photoelectric conversion film 37 are conform with the ends of the first upper electrode 38, the peripheral region of the second upper electrode 39 is formed so as to connect to the insulation film 23, whereby the film stress generated on the first upper electrode 38 in the later heating step is prevented from affecting on the organic photoelectric conversion film 37. In this way, the solid state image sensor 11 can be produced without fluctuating the properties including the dark current and the white flaws of the organic photoelectric conversion film 37.

Also as described above, the organic photoelectric conversion film 37 is patterned by a photolithography technique and dry etching, thereby performing a microfabrication easily. Thus, the pixels 12 in the solid state image sensor 11 can be small-sized.

Next, referring to FIG. 8, a second embodiment of a solid state image sensor will be described. As to a solid state image sensor 11A shown in FIG. 8, the components common to the solid state image sensor 11 shown in FIG. 1 are denoted by the same reference numerals, and thus detailed description thereof will be hereinafter omitted.

Figure 8:
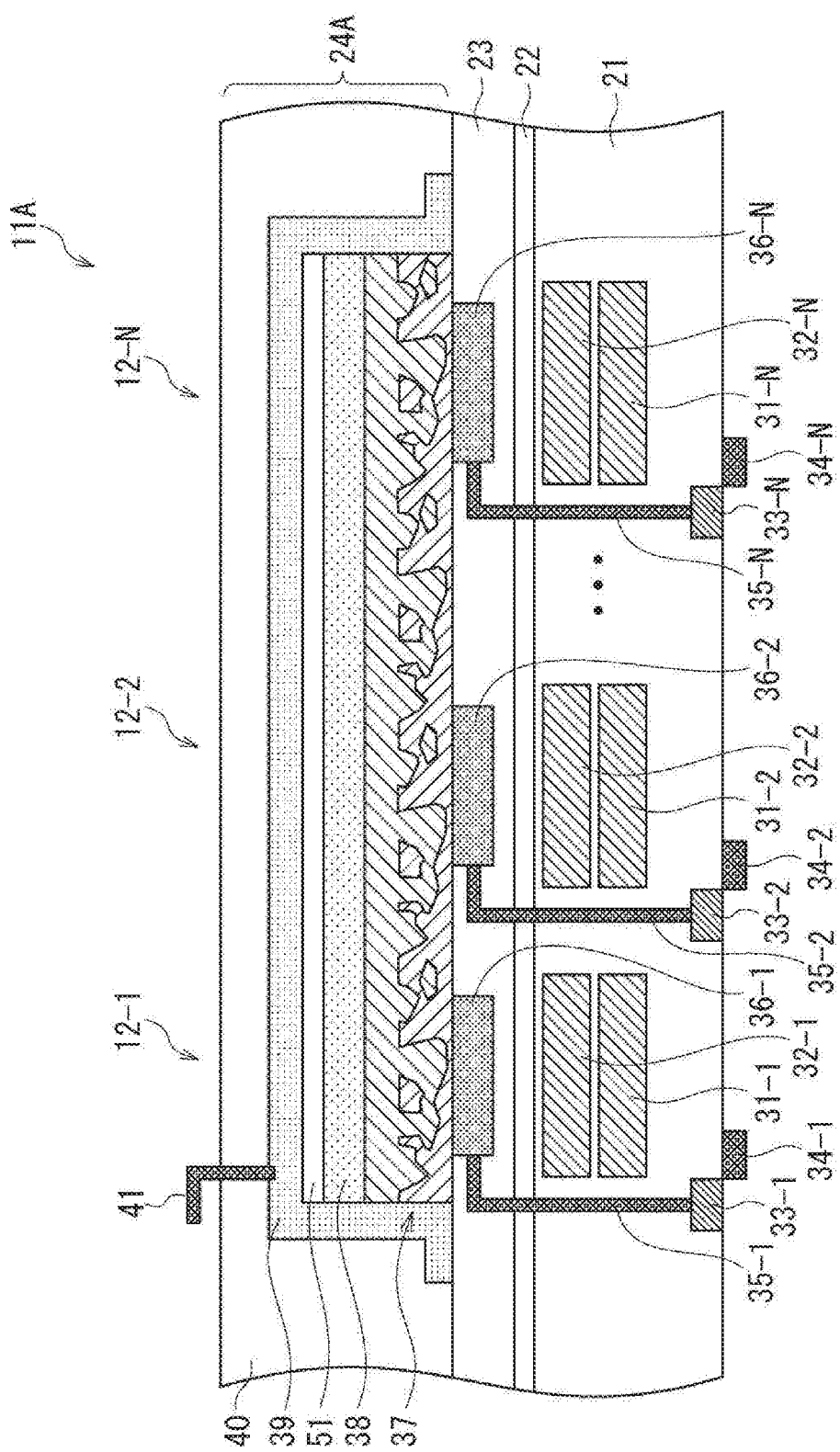
FIG. 8 is a cross-sectional view of a second embodiment of a solid state image sensor with the application of the present disclosure.

As shown in FIG. 8, the solid state image sensor 11A has the same configuration as that of the solid state image sensor 11 shown in FIG. 1 with respect to the semiconductor substrate 21 and the insulation films 22 and 23. However, an organic photoelectric conversion layer 24A of the solid state image sensor 11A is different from the organic photoelectric conversion layer 24 of the solid state image sensor 11 shown in FIG. 1.

In other words, in the organic photoelectric conversion layer 24A of the solid state image sensor 11A, an insulation film 51 is formed between the first upper electrode 38 and the second upper electrode 39. For the insulation film 51, silicon nitride (SiN) is used, for example. After the first upper electrode 38 is formed (the fourth step as described above referring to FIG. 5), the material for the insulation film 51 is formed on an entire surface of the first upper electrode 38. Then, the insulation film 51 is processed together with the organic photoelectric conversion film 37 and the first upper electrode 38 (the fifth step as described above referring to FIG. 6).

Here, the insulation film 51 is transparent to the visible light and should have an ultraviolet ray absorbing property. As the material for the insulation film 51, SiN, $SiO_2$, SiON, AlO, AlN and the like can be used. The conditions for an SiN film formation using a CVD method are: a parallel plate plasma CVD apparatus is used at an RF power of 500 W, a substrate temperature of 200° C., a pressure of 5 Torr, $N_2$ flow rate of 500 sccm, $SiH_4$ flow rate of 500 sccm and $NH_3$ flow rate of 100 sccm. The SiN film formed under the conditions absorbs ultraviolet rays. It is desirable that the insulation film 51 absorb all or a part of the wavelength of 400 nm or less and have a transmittance of 80% or more. The insulation film 51 may have a thickness of about 10 nm to 500 nm.

In FIG. 8, as the insulation film 51, a monolayer film structure such as an SiN or SiON film is shown. However, a multilayer structure having two or more layers may be used. Also, as the material for the insulation film 51, a metal oxide such as titanium oxide, vanadium oxide and chromium oxide can be used, which provides a similar effect.

Also in the solid state image sensor 11A thus configured similar to the solid state image sensor 11, the film stress on the organic photoelectric conversion film 37 can be uniform, and the property fluctuation such as white flaws and the dark current can be suppressed. In addition, as the insulation film 51 is formed in the solid state image sensor 11A, the ultraviolet rays can be absorbed.

Next, referring to FIG. 9, a third embodiment of a solid state image sensor will be described. As to a solid state image sensor 11B shown in FIG. 9, the components common to the solid state image sensor 11 shown in FIG. 1 are denoted by the same reference numerals, and thus detailed description thereof will be hereinafter omitted.

Figure 9:
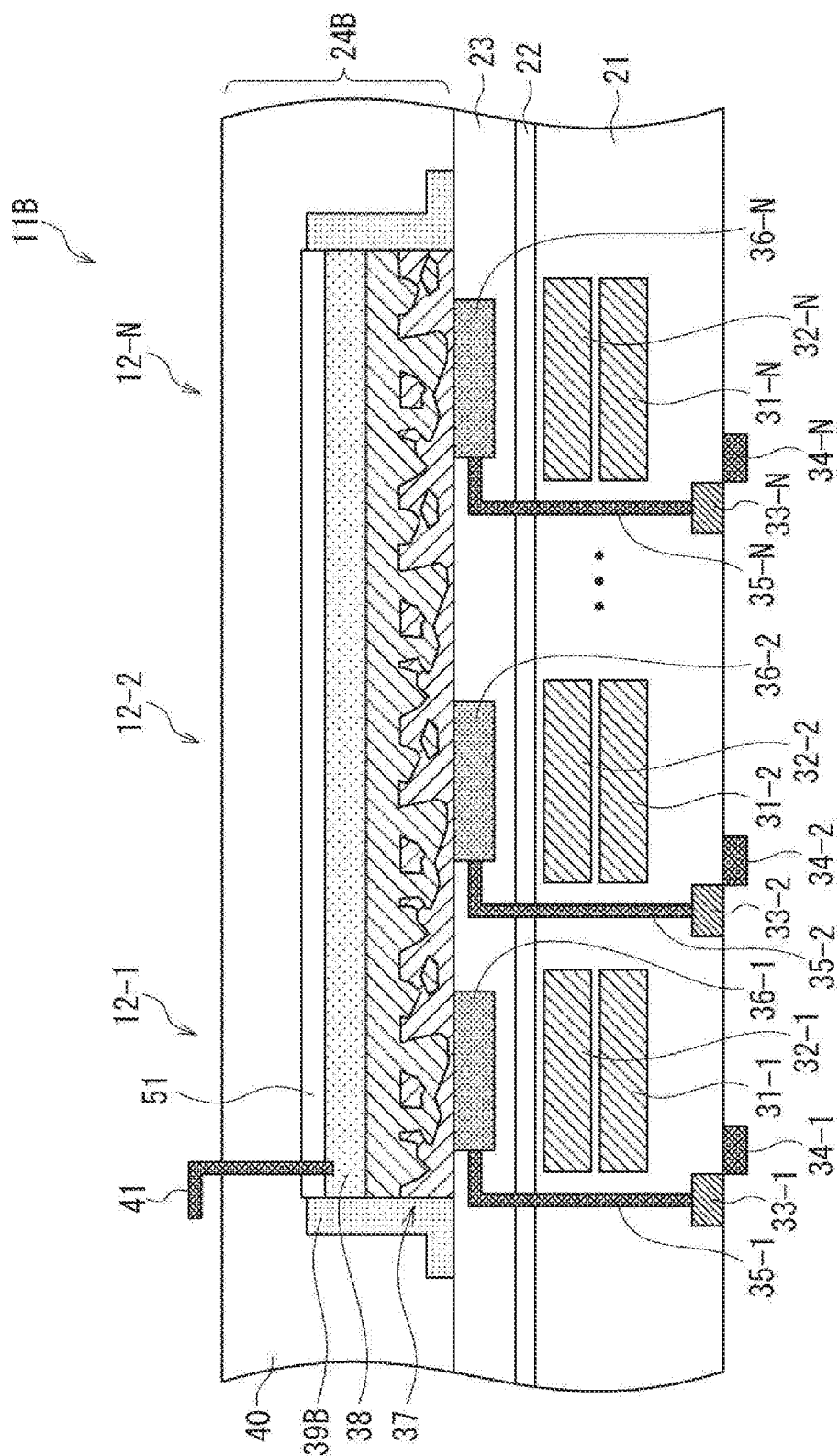
FIG. 9 is a cross-sectional view of a third embodiment of a solid state image sensor with the application of the present disclosure.

As shown in FIG. 9, the solid state image sensor 11B has the same configuration as that of the solid state image sensor 11 shown in FIG. 1 with respect to the semiconductor substrate 21 and the insulation films 22 and 23. However, an organic photoelectric conversion layer 24B of the solid state image sensor 11B is different from the organic photoelectric conversion layer 24 of the solid state image sensor 11 shown in FIG. 1.

In other words, in the organic photoelectric conversion layer 24B of the solid state image sensor 11B, an insulation film 51 is laminated on the first upper electrode 38, and a second upper electrode 39B is formed only outside of the ends of the first upper electrode 38. In other words, the second upper electrode 39B is formed around an outer periphery of the first upper electrode 38 to connect the ends of the first upper electrode 38 and the insulation film 23. In the solid state image sensor 11B, after the insulation film 51 is formed and the second upper electrode 39 is formed similar to the case of the solid state image sensor 11A shown in FIG. 8, the region of the second upper electrode 39 disposed above of the insulation film 51 is removed to form the second upper electrode 39B.

Also in the solid state image sensor 11B thus configured similar to the solid state image sensor 11, the film stress on the organic photoelectric conversion film 37 can be uniform, and the property fluctuation such as white flaws and the dark current can be suppressed. In addition, as the insulation film 51 is formed in the solid state image sensor 11B, the ultraviolet rays can be absorbed. The second upper electrode 39B is formed only around the outer periphery of the first upper electrode 38. This allows to thin the organic photoelectric conversion layer 24B.

Next, referring to FIG. 10, a fourth embodiment of a solid state image sensor will be described. As to a solid state image sensor 11C shown in FIG. 10, the components common to the solid state image sensor 11 shown in FIG. 1 are denoted by the same reference numerals, and thus detailed description thereof will be hereinafter omitted.

Figure 10:
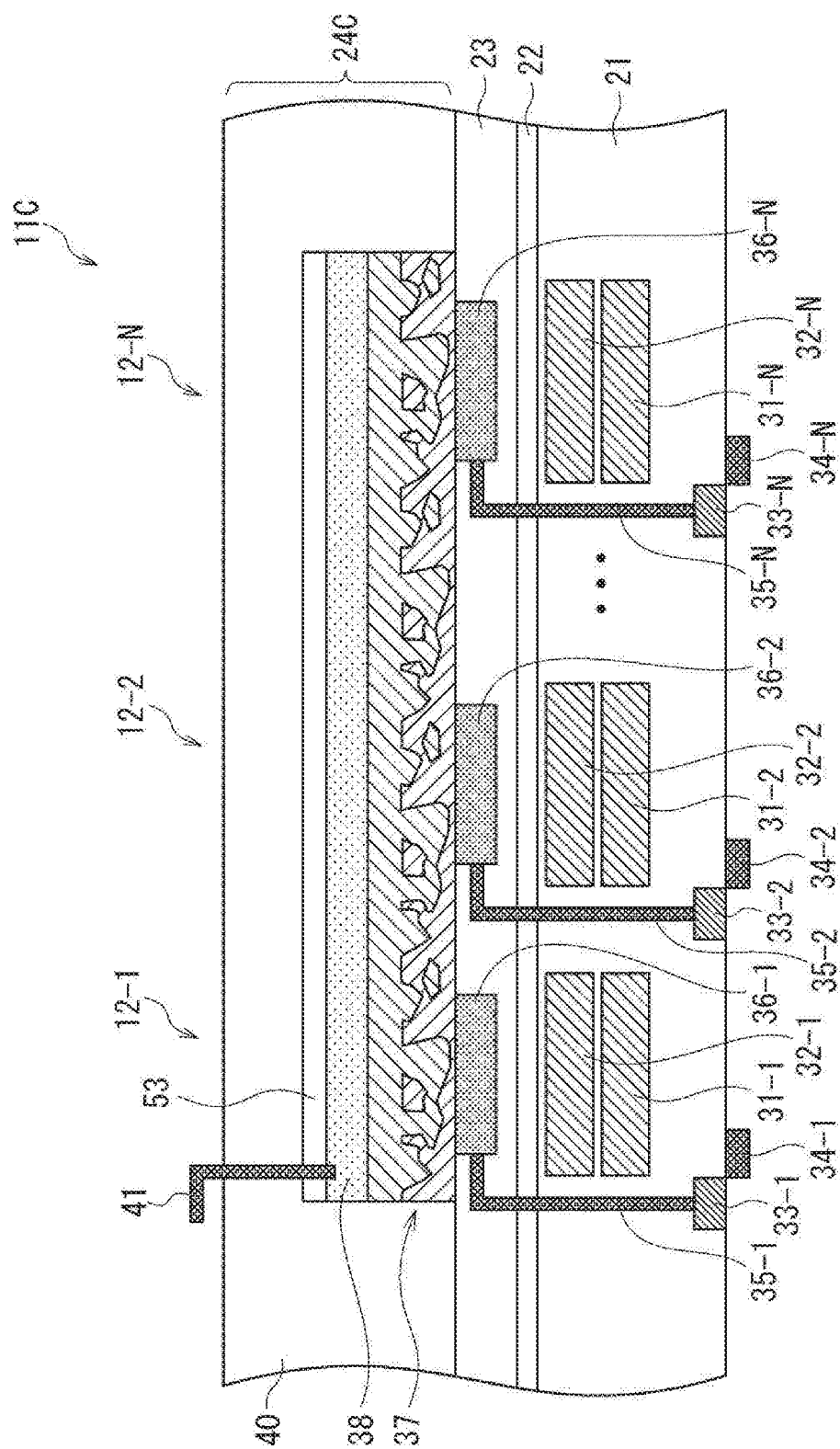
FIG. 10 is a cross-sectional view of a fourth embodiment of a solid state image sensor with the application of the present disclosure.

As shown in FIG. 10, the solid state image sensor 11C has the same configuration as that of the solid state image sensor 11 shown in FIG. 1 with respect to the semiconductor substrate 21 and the insulation films 22 and 23. However, an organic photoelectric conversion layer 24C of the solid state image sensor 11C is different from the organic photoelectric conversion layer 24 of the solid state image sensor 11 shown in FIG. 1.

In other words, in the organic photoelectric conversion layer 24C of the solid state image sensor 11C, ends of the organic photoelectric conversion film 37, the first upper electrode 38 and a stress adjustment insulation film 53, which form a laminated layer, are substantially conform with each other. The film stress of the insulation film 51 is controlled to provide a substantially uniform film stress of the laminated film over an entire surface (for example, neutral at ±200 MPa).

Specifically, after the organic photoelectric conversion film 37 is formed similar to the above-described production method, the first upper electrode 38 is formed. The first upper electrode 38 is formed by a sputtering method. The ITO film is formed by the conditions: an RF sputtering apparatus is used at an RF power of 800 W, a substrate temperature of 20° C., a pressure of 0.2 Torr Ar flow rate of 15 sccm. For example, by controlling the film formation conditions including the RF power, an ITO film stress can be controlled.

Thereafter, the stress adjustment insulation film 53 made of SiN is formed. For example, the stress adjustment insulation film 53 is formed by patterning using a photolithography technique and processing by dry etching. Then, post processing such as asking and organic cleaning is performed to remove deposition and residues.

Here, the stress adjustment insulation film 53 is transparent to the visible light and should have an ultraviolet ray absorbing property similar to the insulation film 51 as described referring to FIG. 8. As the material for the stress adjustment insulation film 53, SiN, $SiO_2$, SiON, AlO, AlN and the like can be used. The conditions for an SiN film formation using a CVD method are: a parallel plate plasma CVD apparatus is used at an RF power of 500 W, a substrate temperature of 200° C., a pressure of 5 Torr, $N_2$ flow rate of 500 sccm, $SiH_4$ flow rate of 500 sccm and $NH_3$ flow rate of 100 sccm. As to the stress adjustment insulation film 53, by controlling the film formation conditions including the RF power, the film stress can be controlled.

As described above, by controlling the conditions for forming the first upper electrode 38 and the stress adjustment insulation film 53, the film stress can be neutral (±200 MPa, + denotes compression and − denotes a direction of tensile stress) when the first upper electrode 38 and the stress adjustment insulation film 53 are laminated. In this way, similar to the solid state image sensor 11 shown in FIG. 1, in the solid state image sensor 11C, the film stress on the organic photoelectric conversion film 37 can be uniform, and the property fluctuation such as white flaws and the dark current can be suppressed.

The present disclosure can be applied not only to the solid state image sensor 11 having the configuration that the photoelectric conversion regions 31 and 32 are formed within the semiconductor substrate 21 and the organic photoelectric conversion film 37 is formed at the light irradiated plane side of the semiconductor substrate 21, but also to solid state image sensors having other configurations. In addition, the present disclosure can be applied not only to a rear surface (i.e., a rear surface opposite to a surface of the semiconductor substrate 21 where the multilayer wiring layer and the support substrate are laminated) irradiation type solid state image sensor where a rear surface of the solid state image sensor 11 is irradiated with light, but also to other solid state image sensors including a surface irradiated type solid state image sensor.

The solid state image sensor 11 according to the above-described embodiments can be applied to a variety of electronic devices including an image capturing system such as a digital still camera and digital video camera, a mobile phone having an image capturing function and other devices having an image capturing function.

Figure 11:
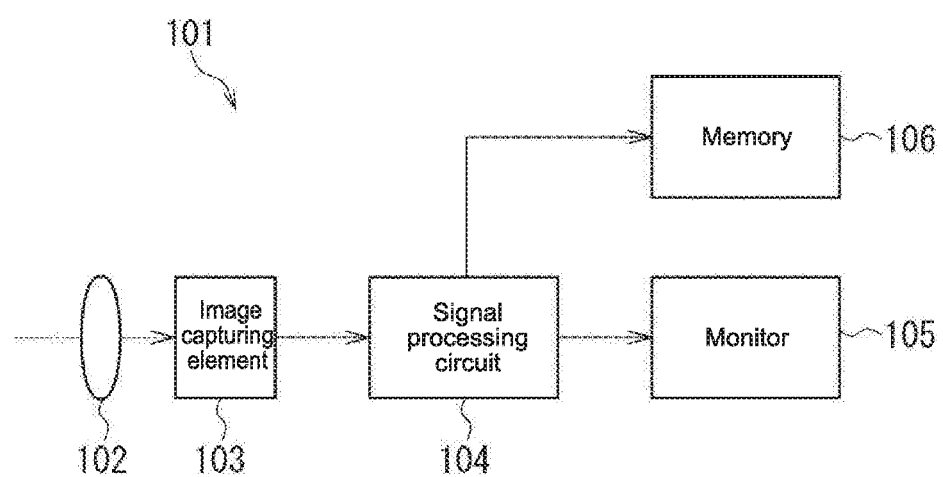
FIG. 11 is a block diagram showing a configuration of an imaging apparatus mounted on an electronic device.

FIG. 11 is a block diagram showing a configuration of an imaging apparatus mounted on an electronic device.

As shown in FIG. 11, an image capturing apparatus 101 is configured to have an optical system 102, an image capturing element 103, a signal processing circuit 104, a monitor 105 and a memory 106, and can capture still images and moving images.

The optical system 102 is configured to have one or more lenses, leads image light (incident light) from an object to be captured to the image capturing element 103, and captures the image light on a light receiving plane (a sensor unit) of the image capturing element 103.

To the image capturing element 103, the solid state image sensor 11 according to the above-described embodiments is applied. In the image capturing element 103, electrons are accumulated for a predetermined duration depending on the image captured on the light receiving plane via the optical system 102. A signal corresponding to the electrons accumulated on the image capturing element 103 is fed to the signal processing circuit 104.

The signal processing circuit 104 processes a pixel signal outputted from the image capturing element 103 in various ways. By the signal processing of the signal processing circuit 104, the resultant image (image data) is fed to and displayed on the monitor 105 or fed to and stored (recorded).

By applying the solid state image sensor 11 according to the above-described embodiments, the image capturing apparatus 101 thus configured can provide high quality images, for example.

The present disclosure may have the following configurations.

(1) A solid state image sensor, including:

a semiconductor substrate where photoelectric conversion regions for converting light into charges are arranged per a plurality of pixels planarly arranged;

an organic photoelectric conversion film laminated at a light irradiated side of the semiconductor substrate via an insulation film and formed at the regions where a plurality of the pixels are formed;

a lower electrode formed at and in contact with the organic photoelectric conversion film at a semiconductor substrate side;

a first upper electrode laminated at a light irradiated side of the organic photoelectric conversion film and formed such that ends of the first upper electrode are substantially conform with ends of the organic photoelectric conversion film when the solid state image sensor is planarly viewed; and a film stress suppressor for suppressing an effect of a film stress on the organic photoelectric conversion film, the film stress being generated on the first upper electrode.

(2) The solid state image sensor according to (1) above, in which the film stress suppressor is a second upper electrode laminated at a light irradiated side of the first upper electrode, and the second upper electrode is formed on the first upper electrode at a region greater than a region where the first upper electrode is formed to connect a peripheral region of the second upper electrode to the insulation film.

(3) The solid state image sensor according to (2) above, in which the first upper electrode and the second upper electrode are formed of a same material or a material having a substantially same property.

(4) The solid state image sensor according to any one of (1) to (3) above, further including:
a second insulation film laminated on the first upper electrode such that ends of the organic photoelectric conversion film and the first upper electrode are substantially conformed.

(5) The solid state image sensor according to any one of (1) to (4) above, in which
the film stress suppressor is formed around an outer periphery of the first upper electrode to connect the ends of the first upper electrode and the insulation film.

(6) The solid state image sensor according to any one of (1) to (5) above, in which
the film stress suppressor is a stress adjustment insulation film laminated on the first upper electrode such that ends of the first upper electrode is substantially conform with the stress adjustment insulation film, and the stress adjustment insulation film is formed under the condition that the film stress generated on the first upper electrode becomes substantially uniform.

(7) A method of producing a solid state image sensor, including:
forming and laminating an organic photoelectric conversion film on a semiconductor substrate via an insulation film at a light irradiated side and at the regions where a plurality of pixels are formed, photoelectric conversion regions for converting light into charges being arranged per a plurality of the pixels planarly arranged on the semiconductor substrate;
forming a lower electrode per the pixels in contact with the organic photoelectric conversion film at a semiconductor substrate side;
forming a first upper electrode laminated at a light irradiated side of the organic photoelectric conversion film such that ends of the first upper electrode are substantially conform with ends of the organic photoelectric conversion film when the solid state image sensor is planarly viewed; and
forming a film stress suppressor for suppressing an effect of a film stress on the organic photoelectric conversion film, the film stress being generated on the first upper electrode.

(8) An electronic device, including: a solid state image sensor, including:
a semiconductor substrate where photoelectric conversion regions for converting light into charges are arranged per a plurality of pixels planarly arranged;
an organic photoelectric conversion film laminated at a light irradiated side of the semiconductor substrate via an insulation film and formed at the regions where a plurality of the pixels are formed;
a lower electrode formed at and in contact with the organic photoelectric conversion film at a semiconductor substrate side;
a first upper electrode laminated at a light irradiated side of the organic photoelectric conversion film and formed such that ends of the first upper electrode are substantially conform with ends of the organic photoelectric conversion film when the solid state image sensor is planarly viewed; and
a film stress suppressor for suppressing an effect of a film stress on the organic photoelectric conversion film, the film stress being generated on the first upper electrode.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device, comprising:
a first photodiode disposed in a semiconductor substrate;
a first insulating layer disposed above the semiconductor substrate;
a first lower electrode disposed within the first insulating layer;
an organic photoelectric conversion film disposed directly above the first insulating layer;
an upper electrode disposed above the organic photoelectric conversion film; and
a film disposed over the organic photoelectric conversion film and the upper electrode,
wherein the first lower electrode is disposed between the organic photoelectric conversion film and the first photodiode,
wherein, in a plan view, a first plane area of the film is greater than a plane area of the upper electrode,
wherein the film is in physical contact with the first insulating layer; and
wherein the first insulating layer is a single layer insulating layer.

2. The imaging device according to claim 1, wherein the film is transparent to visible light.

3. The imaging device according to claim 1, wherein the film absorbs light with a wavelength of about 400 nm or less.

4. The imaging device according to claim 1, wherein the film is configured to suppress a strain of the upper electrode.

5. The imaging device according to claim 1, wherein the first photodiode and the first lower electrode correspond to a first pixel.

6. The imaging device according to claim 1, further comprising:
a second photodiode disposed in the semiconductor substrate; and
a second lower electrode disposed in the first insulating layer,
wherein the second lower electrode is disposed between the organic photoelectric conversion film and the second photodiode.

7. The imaging device according to claim 6,
wherein the first photodiode and the first lower electrode correspond to a first pixel and the second photodiode and the second lower electrode correspond to a second pixel.

8. The imaging device according to claim 1,
wherein the film covers a side surface of the upper electrode and a side surface of the organic photoelectric conversion film.

9. The imaging device according to claim 1,
wherein the upper electrode and the film are formed of a same material.

10. The imaging device according to claim 1,
wherein the film is disposed around an outer periphery of the upper electrode.

11. The imaging device according to claim 1,
wherein ends of the upper electrode substantially conform with ends of the organic photoelectric conversion film.

12. The imaging device according to claim 1, further comprising a second photodiode disposed between the first photodiode and the first lower electrode.

13. The imaging device according to claim 1,
wherein a light incident side of the first lower electrode is substantially co-planar with a light incident side of the first insulating layer.

14. The imaging device according to claim 1, further comprising a second insulating layer disposed above the upper electrode, wherein the film is disposed over the second insulating layer.

15. The imaging device according to claim 14, wherein the second insulating layer is transparent to visible light.

16. The imaging device according to claim 14, wherein the second insulating layer absorbs light with a wavelength of about 400 nm or less.

17. The imaging device according to claim 1, wherein the upper electrode is transparent to visible light.

18. The imaging device according to claim 1, wherein the upper electrode absorbs light with a wavelength of about 400 nm or less.

19. The imaging device according to claim 1, wherein the organic photoelectric conversion film includes a structure having at least one of an organic p type semiconductor and an organic n type semiconductor.

20. An electronic device, comprising:
an optical system;
an imaging device, comprising:
   a first photodiode disposed in a semiconductor substrate;
   a first insulating layer disposed above the semiconductor substrate;
   a first lower electrode disposed within the first insulating layer;
   an organic photoelectric conversion film disposed directly above the first insulating layer;
   an upper electrode disposed above the organic photoelectric conversion film; and
   a film disposed over the organic photoelectric conversion film and the upper electrode,
   wherein the first lower electrode is disposed between the organic photoelectric conversion film and the first photodiode,
   wherein, in a plan view, a first plane area of the film is greater than a plane area of the upper electrode, and
   wherein the film is in contact with the first insulating layer;
signal processing circuitry; and
   wherein the first insulating layer is a single layer insulating layer.

* * * * *